United States Patent
Kai et al.

(10) Patent No.: US 10,868,364 B2
(45) Date of Patent: Dec. 15, 2020

(54) WIRELESS MODULE AND METHOD FOR MANUFACTURING THE SAME

(71) Applicant: TAIYO YUDEN CO., LTD., Tokyo (JP)

(72) Inventors: Takehiko Kai, Tokyo (JP); Masaya Shimamura, Tokyo (JP); Mikio Aoki, Tokyo (JP); Jin Mikata, Tokyo (JP); Taiji Ito, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 15/828,160

(22) Filed: Nov. 30, 2017

(65) Prior Publication Data

US 2018/0159216 A1 Jun. 7, 2018

(30) Foreign Application Priority Data

Dec. 1, 2016 (JP) ................. 2016-233911

(51) Int. Cl.
*H01Q 1/38* (2006.01)
*H01Q 1/52* (2006.01)
*H01Q 1/22* (2006.01)
*H01L 23/31* (2006.01)
*H01L 23/552* (2006.01)
(Continued)

(52) U.S. Cl.
CPC ......... *H01Q 1/526* (2013.01); *H01L 23/3121* (2013.01); *H01L 23/552* (2013.01); *H01L 23/66* (2013.01); *H01Q 1/2283* (2013.01); *H01Q 1/38* (2013.01); *H01L 2223/6677* (2013.01); *H01Q 23/00* (2013.01)

(58) Field of Classification Search
CPC ........ H01Q 1/38; H01Q 1/526; H01Q 1/2283; H01L 23/3121; H01L 21/563; H05K 13/00
See application file for complete search history.

(56) References Cited

U.S. PATENT DOCUMENTS 7,342,299 B2 * 3/2008 Gaucher ............... H01O 23/00
  257/674
8,874,048 B2 * 10/2014 Tsutsumi .............. H01Q 9/00
  455/106
9,887,454 B2 * 2/2018 Ito ......................... H01Q 1/526
(Continued)

FOREIGN PATENT DOCUMENTS

JP 2004-165531 A 6/2004
JP 2010-080699 A 4/2010
(Continued)

OTHER PUBLICATIONS

Japanese Office Action dated Oct. 2, 2018, in a counterpart Japanese patent application No. 2016-233911. (A machine translation (not reviewed for accuracy) attached.).

Primary Examiner — Ab Salam Alkassim, Jr.
(74) Attorney, Agent, or Firm — Chen Yoshimura LLP

(57) ABSTRACT

Solution is preparing a substrate; covering an electronic component mounting region and an antenna mounting region of the substrate with a resin material having viscosity or fluidity; curing the resin material to form a resin layer, and thereafter performing grinding or polishing so as to substantially flatten a surface of the resin layer on the electronic component mounting region and the antenna mounting region; and covering the flattened resin layer with a shielding material having viscosity or fluidity.

6 Claims, 10 Drawing Sheets

(51) Int. Cl.
 *H01L 23/66* (2006.01)
 *H01Q 23/00* (2006.01)

(56) References Cited

U.S. PATENT DOCUMENTS

| | | | | |
|---|---|---|---|---|
| 10,256,535 | B2* | 4/2019 | Nguyen | H01L 23/66 |
| 10,529,668 | B2* | 1/2020 | Kitazaki | H01L 21/78 |
| 10,601,106 | B2* | 3/2020 | Ito | H01Q 1/243 |
| 10,665,936 | B2* | 5/2020 | Mikata | H01L 23/66 |
| 10,714,822 | B2* | 7/2020 | Mikata | B32B 5/145 |
| 2005/0037535 | A1* | 2/2005 | Ogawa | H01L 23/49833 438/106 |
| 2008/0019112 | A1* | 1/2008 | Hatanaka | H01L 23/3121 361/814 |
| 2008/0210462 | A1* | 9/2008 | Kawagishi | H01L 25/165 174/377 |
| 2009/0002967 | A1* | 1/2009 | Asami | H01L 23/552 361/816 |
| 2009/0051606 | A1* | 2/2009 | Ochi | H01Q 1/2225 343/702 |
| 2009/0256244 | A1* | 10/2009 | Liao | H01L 21/568 257/660 |
| 2011/0006106 | A1* | 1/2011 | Kanryo | H01L 23/552 228/170 |
| 2013/0093629 | A1* | 4/2013 | Chiu | H01Q 1/52 343/700 MS |
| 2013/0185934 | A1* | 7/2013 | Toyoda | C08L 63/00 29/841 |
| 2013/0222196 | A1* | 8/2013 | Hashimoto | H01Q 13/10 343/767 |
| 2013/0225102 | A1* | 8/2013 | Tsutsumi | H01L 23/552 455/90.2 |
| 2013/0301227 | A1* | 11/2013 | Kawano | H01L 21/561 361/748 |
| 2014/0028518 | A1* | 1/2014 | Arnold | H01Q 1/2283 343/841 |
| 2015/0131231 | A1* | 5/2015 | Yoo | H05K 3/4007 361/707 |
| 2015/0138030 | A1* | 5/2015 | Yosui | H01Q 1/38 343/895 |
| 2015/0262842 | A1* | 9/2015 | Iijima | H01L 21/52 257/664 |
| 2016/0149300 | A1* | 5/2016 | Ito | H01Q 23/00 |
| 2017/0092633 | A1* | 3/2017 | Tomonari | H01L 21/561 |
| 2017/0185108 | A1* | 6/2017 | Sasaki | B32B 5/12 |
| 2017/0347462 | A1* | 11/2017 | Miwa | H01L 24/97 |
| 2017/0354039 | A1* | 12/2017 | Miwa | H05K 9/0022 |
| 2018/0096948 | A1* | 4/2018 | Kim | H01L 21/561 |
| 2018/0151951 | A1* | 5/2018 | Ikemoto | H01Q 7/06 |
| 2018/0159209 | A1* | 6/2018 | Mikata | H01Q 1/38 |
| 2018/0159217 | A1* | 6/2018 | Mikata | H01L 23/552 |
| 2018/0166767 | A1* | 6/2018 | Ito | H04B 1/38 |
| 2018/0182715 | A1* | 6/2018 | Kim | H01L 21/6835 |
| 2018/0286796 | A1* | 10/2018 | Kitazaki | H05K 9/0081 |
| 2018/0286816 | A1* | 10/2018 | Kitazaki | H01L 23/28 |
| 2018/0286817 | A1* | 10/2018 | Kitazaki | H01L 21/56 |
| 2019/0310687 | A1* | 10/2019 | Hong | H05K 1/0218 |
| 2019/0372210 | A1* | 12/2019 | Mikata | H01L 23/3121 |

FOREIGN PATENT DOCUMENTS

| | | |
|---|---|---|
| JP | 2011-151226 A | 8/2011 |
| JP | 2013-179152 A | 9/2013 |
| WO | 2015/015863 A1 | 2/2015 |
| WO | 2016/092694 A1 | 6/2016 |

* cited by examiner

WIRELESS MODULE AND METHOD FOR MANUFACTURING THE SAME

CROSS-REFERENCE TO RELATED APPLICATION

This application claims the benefit of priority to Japanese Patent Application No. 2016-233911, filed Dec. 1, 2016, of which full contents are incorporated herein by reference.

BACKGROUND

Technical Field

The present disclosure relates to a wireless module and a method for manufacturing the wireless module.

Background Art

These days, various electronic devices, i.e., wearable devices, comprise ultra-small wireless modules, each of which is configured such that an electronic circuit and an antenna capable of transmitting or receiving radio waves are mounted on a single substrate.

In such a wireless module, in order to minimize leakage of noise caused by the electronic circuit, such a technique has been developed that the electronic circuit on the substrate is sealed with a resin and the surface of the resin is covered with a metal layer.

In this wireless module, the resin applied to the substrate is cured to form a resin layer, and a metal layer for shielding is formed on its surface. Further, an electronic component is disposed in an electronic circuit mounting region, while a conductive pattern of an antenna, which is greatly thinner than the electronic component, is formed in an antenna mounting region. As a consequence of these thicknesses of the electronic component and antenna, a surface of the resin layer applied by a potting method or a printing method includes a portion on the electronic component having a greater height from the substrate, and a portion on the antenna having a height smaller than the portion on the electronic component.

With respect to a resin layer thickness, the resin layer is formed to have a greater thickness in the antenna mounting region, partly because the resin layer before curing has fluidity.

That is, the height of the resin surface decreases from the electronic component mounting region side to the antenna mounting region side. Furthermore, the resin thickness in the antenna mounting region is greater since the resin flowing therein, and correspondingly its resin cure shrinkage becomes greater. In addition, in the case of printing using a squeegee, since the squeegee scrapes off the resin layer on the antenna mounting region side, a difference in height further increases.

Consequently, the surface of the resin layer is not formed flat. Thus, when a metal layer covering the surface of the resin layer is a conductive paste, e.g., Ag paste, for the printing method or a liquid coating material for a spin coating method, the metal layer is thickened at such a recessed portion of the resin layer, due to its fluidity. This tends to correspondingly increase the amount of use of such a conductive paste, i.e., a material of the metal layer.

In other words, an excessive shielding material is required in the recessed portion. Further, this conductive paste or coating material is obtained by highly dispersing metal powder, e.g., gold, silver, or nickel, and thus is more expensive than the resin layer. Accordingly, increase in conductive paste use causes increase in the cost of the wireless module.

SUMMARY

A primary aspect of the disclosure for achieving advantages described above is a method for manufacturing a wireless module, comprising: a preparing step of preparing a substrate, the substrate including an electronic component provided in an electronic component mounting region, and a conductive pattern formed on at least one of a front surface, an inner layer, and a back surface of the substrate, the conductive pattern being provided in an antenna mounting region adjacent to the electronic component mounting region, the conductive pattern being configured to act as an antenna, a covering step of covering the electronic component mounting region and the antenna mounting region of the substrate with a resin material having viscosity and fluidity, a grinding or polishing step of curing the resin material to form a resin layer, and thereafter, performing grinding or polishing so as to substantially flatten a surface of the resin layer on the electronic component mounting region and the antenna mounting region, and a covering step of covering the flattened resin layer with a shielding material having viscosity and fluidity.

Other features of the present disclosure will be made clear through the present specification with reference to the accompanying drawings. At least the following details will become apparent from descriptions of the present specification and of the accompanying drawings

DETAILED DESCRIPTION

Figure 1A:
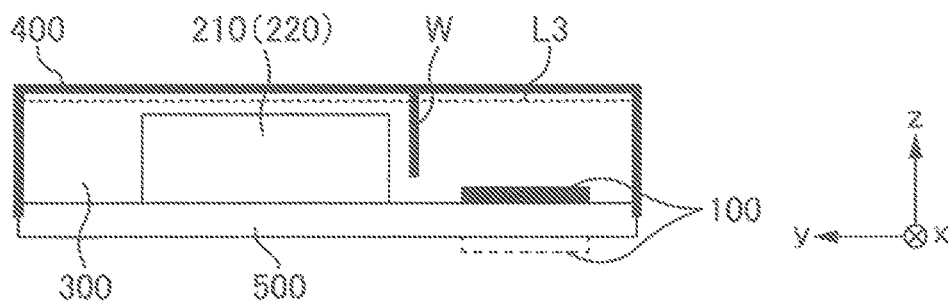
FIG. 1A is a cross-sectional view illustrating a wireless module according to an embodiment of the present disclosure.

A wireless module and a method for manufacturing the wireless module according to an embodiment of the present disclosure will be described hereinafter with reference to the drawings as appropriate. Throughout the drawings, the same components are denoted by the same reference numerals. As used herein, the singular forms "a", "an", and "the" are intended to include the plural forms as well, unless the context clearly indicates otherwise.

SUMMARY

First, the summary of an embodiment of the present disclosure will be simply described again. FIG. 1D illustrates how a resin layer is formed.

A reference numeral 500 denotes a substrate, reference numerals 210, 220 denote an electronic component such as a semiconductor device, a chip resistor, a chip capacitor, and a crystal oscillator, a reference numeral 100 denotes an antenna (formed by a Cu pattern of a printed circuit board) disposed on a front or a back surface of the substrate. Note that a semiconductor device includes a device where a bare chip is mounted face-up, a device where a bare chip is mounted face down as in Wafer Level Package (WLP), a package configured such that a bare chip is sealed by a resin, and the like. In any case, the semiconductor device is a hexahedron having a front surface, a back surface and side surfaces.

Assuming that such a constituent requiring a single wireless module is one unit, a plurality of units is arranged in a matrix on a large substrate. FIG. 1D, however, illustrates two adjacent units.

As illustrated in FIG. 1D, a semiconductor device 210 and/or an electronic component 220 is mounted in an electronic component mounting region 501 of a substrate 500, while an antenna 100 is provided in an antenna mounting region (502 or 504) adjacent to the electronic component mounting region 501. The antenna 100 is formed on a front, back, or inner layer of the substrate 500, and is made of the same material as the material of a conductive pattern used for the front, back, and/or inner layer of the substrate 500. In the printed circuit board, the antenna 100 is made of Cu, whereas, in a ceramic substrate, the antenna 100 is made of sintering of a conductive paste. Since the antenna 100 may be disposed on any one of the front, back, and inner layers of the substrate 500, the antenna 100 is illustrated by dotted lines on the back side.

The substrate 500 in this state is prepared, and subsequently, a covering (coating) process using a resin material is performed. In specific, a potting method or a printing method is employed. The potting method is performed such that a fluid resin is dropped on the substrate 500 from above to cover it. The printing method is performed such that a metal mask or a silk mask is employed, fluid ink provided on the mask is rubbed with a squeegee, and a resin is applied onto the substrate 500 that is disposed on the back surface of the mask.

The tallest component among the components disposed in the electronic component mounting region 501 is the semiconductor device 210 and here is an LSI chip having a height of 0.4 mm. In a discrete circuit, a chip capacitor has a height of 0.2 mm. Then, the pattern of the antenna 100 has a thickness of 0.02 mm. That is, the difference in height between the pattern of the antenna 100 and the tallest electronic component 210 is 0.38 mm, and the difference in height corresponds to the thickness of the LSI from which substantially the thickness of the antenna 100 is subtracted. Although here the LSI chip 210 is the tallest, another component may be the tallest depending on components.

Thus, when a resin material is applied in a normal manner, fluidity and viscosity of the resin material causes a difference in height as depicted by a dotted line L1 in FIG. 1D. Since a resin having viscosity is provided in such a place where the tall electronic component 210 has a great height while a portion corresponding to the antenna 100 has a small height, a surface of a resin layer 300 is formed as if tracing the great and small heights. Here, this is expressed as, for example, "swells" such as waves. In the printing method, a squeegee is made of a resin such as Teflon (registered trademark), and its elasticity causes a resin over the antenna 100 to be scraped off. Furthermore, viscosity of the resin highly tends to maintain such a difference in height, thereby further increasing the difference in height. Accordingly, a hatched region R1 results in an accumulation place of a shielding material on the surface of the resin layer 300. Further, a resin applied to an upper corner portion of the semiconductor device 210 has a resin thickness smaller as illustrated by a portion P1.

That is, a shielding material 400 having fluidity is relatively thin on the electronic component 210, 220, while the shielding material 400 is thick in the antenna mounting region 502 since the resin layer 300 is recessed and the shielding material is accumulated. Thus, this accumulation portion R1 also corresponds to a portion where a conductive material is unnecessarily consumed. Since metal or precious metal is used for the shielding material, the cost is increased.

Further, the portion P1 is such a portion that both the resin layer 300 and a shielding layer 400 are thinner, and "swells" can cause reduction in withstand voltage and environmental resistance.

Thus, in an embodiment of the present disclosure, grinding or polishing is performed so that a surface of the resin layer 300 on the electronic component mounting region 501 and the antenna mounting region 502 (504) will become a substantially flat surface.

For example, a resin material is applied such that the height of the lowest part of the recessed portion (the height from the substrate surface) H2 becomes higher than a height H1 of the thickest electronic component (tallest component) 210, for example, as indicated by a line L2. This makes it possible to perform grinding or polishing such that a surface of the resin layer 300 on the electronic component mounting region 501 and the antenna mounting region 502 (504) becomes substantially flattened at a line L3.

As an example of this polishing/grinding, specifically, a dicing apparatus is employed to perform polishing using a dicing blade. The dicing blade having a certain width is used to polish a first region so that a surface thereof becomes substantially flattened along a y-direction, i.e., the line L3. Thereafter, the dicing blade is displaced in an x-direction so as to partially overlap with the first region, and a second region is polished in the y-direction. With this process being repeated, a surface of the resin layer 300 on the electronic component mounting region 501 and the antenna mounting region 502 is substantially flattened at a level at L3.

Note that when the tallest portion is the back surface of the LSI chip, this back surface may be exposed by this polishing/grinding, however, polishing/grinding is commonly performed with a thickness of 100 μm being left.

Thereafter, this is covered (coated) with the viscous or fluid shielding material. Since the resin layer 300 is formed to be substantially flat at L3, the shielding layer 400 can be formed with a predetermined thickness without an unnecessarily consumed portion.

Note that the position at L3 varies with processing accuracy of a dicing apparatus and a required thickness of a sealing resin. Furthermore, the shielding material can be formed by the printing method, a conductive resin paste having viscosity into which powder of metal, such as Ag, Pd, Pt or Cu, is mixed.

Further, a spinning method also can be used. This is performed by spin coating, using a coating agent that has viscosity further less than that of the conductive paste and is closer to liquid. The coating agent is made of resin, metal powder, and solvent.

In either of the methods, the covering shielding material is heated and subjected to cure treatment, thereby forming the shielding layer 400.

Figure 1B:
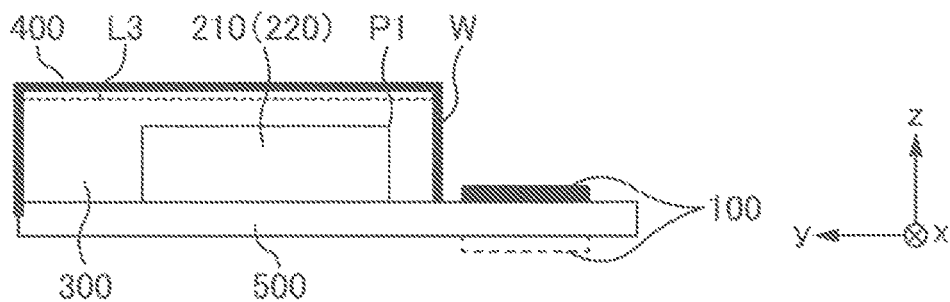
FIG. 1B is a cross-sectional view illustrating a wireless module according to an embodiment of the present disclosure.
Figure 1C:
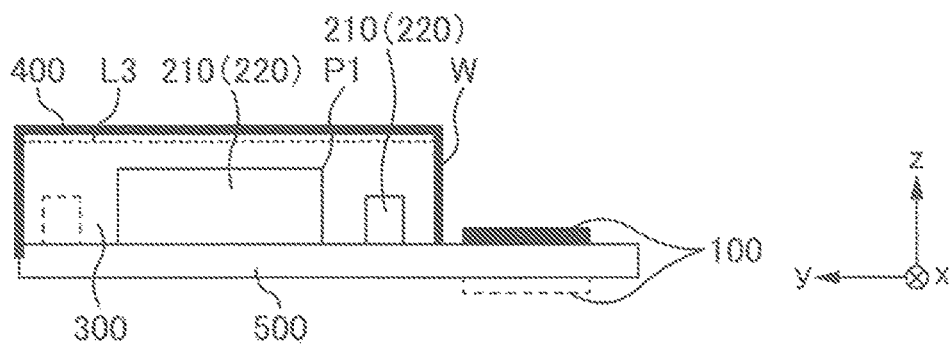
FIG. 1C is a cross-sectional view illustrating a wireless module according to an embodiment of the present disclosure.
Figure 1D:
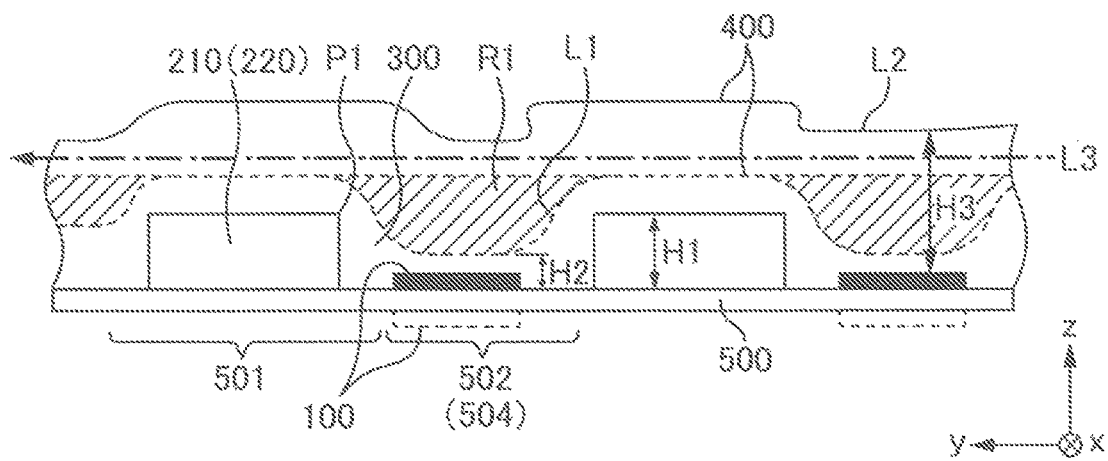
FIG. 1D is a cross-sectional view illustrating a wireless module according to an embodiment of the present disclosure.

FIGS. 1A to 1C illustrate a wireless module 1000 achieved through the aforementioned processes.

FIG. 1A illustrates the wireless module 1000 in which the electronic component 210 (or 220) is mounted to the substrate 500, and the antenna 100 is formed on the back or front side of the substrate 500. As in FIG. 1A, polishing is performed at L3 so as to substantially flatten a surface of the resin layer 300 on the electronic component mounting region 501 and the antenna mounting region 502 (504). Thus, the shielding layer 400 can be formed to have a predetermined film thickness without the unnecessarily thick portion R1.

Note that, in FIGS. 1A to 1C, dotted lines provided near the surface indicates that such a flattening processing is performed at the position L3 in FIG. 1D using a polishing/grinding apparatus.

A portion indicated by a reference sign W is integrated with the shielding layer 400, and is a side wall of the shielding layer 400 which is a partition between the electronic component mounting region 501 and the antenna mounting region 502.

Subsequently, FIGS. 1B and 1C illustrate the wireless module 1000 configured such that the shielding layer 400 is formed by performing polishing at the line L3 in FIG. 1D, and then the resin layer 300 and the shielding layer 400 corresponding to the antenna mounting region 502 is ground and polished at least from the surface toward a lower layer. Here, removal is performed by the dicing apparatus.

As a result, the surface of the electronic component mounting region 501 is substantially flat from right to left in the drawing, including the corner portion region P1, by virtue of polishing. Consequently, the shielding layer 400 can be prevented from being partially formed thinner at the corner portion P1 of the electronic component 210, 220. This can minimize reduction in environmental resistance and withstand voltage of the electronic component 210, 220, thereby being able to enhance shielding performance.

Note that, in FIG. 1C, in order to ease unevenness depicted by the line L2, the electronic component 220, which is thicker than the antenna 100 and thinner than the semiconductor device (tallest element) 210, is disposed between the semiconductor device (tallest element) 210 and the antenna mounting region 502, or between the semiconductor device (tallest element) 210 and another antenna mounting region 502 adjacent thereto, so that unevenness of the line L1 is eased. As a result, the amount of removal portion depicted by L2 can be reduced, and shortening of the process and reduction in the amount of discarded materials can be achieved. This electronic component 220 that is thinner than the semiconductor device 210 is, for example, a chip capacitor, a chip resistor, a crystal oscillator, or the like.

First Embodiment

==Wireless Module==

Figure 2A:
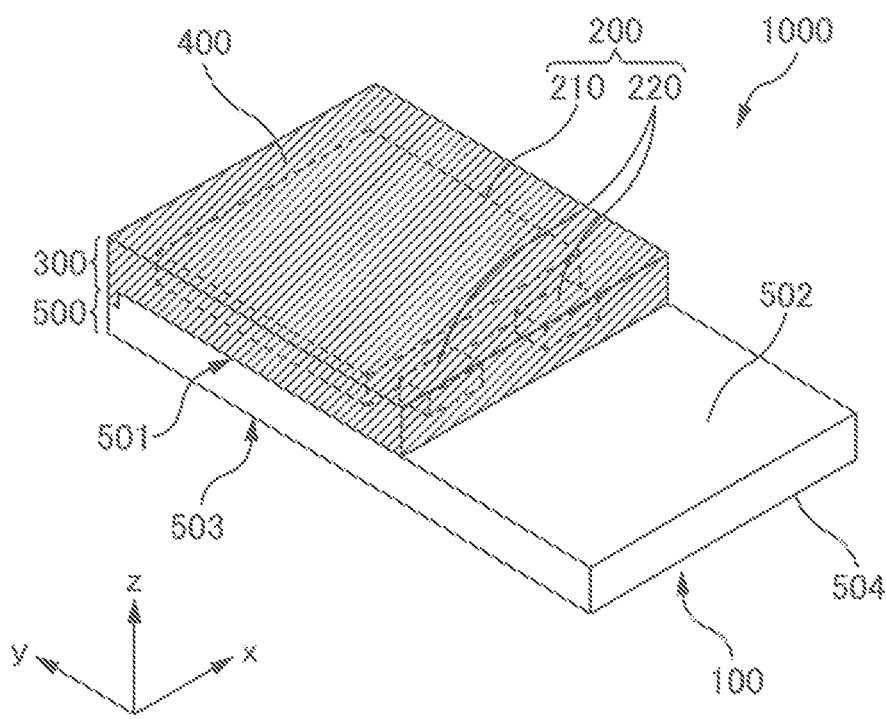
FIG. 2A is an external perspective view illustrating a wireless module according to an embodiment of the present disclosure.
Figure 2B:
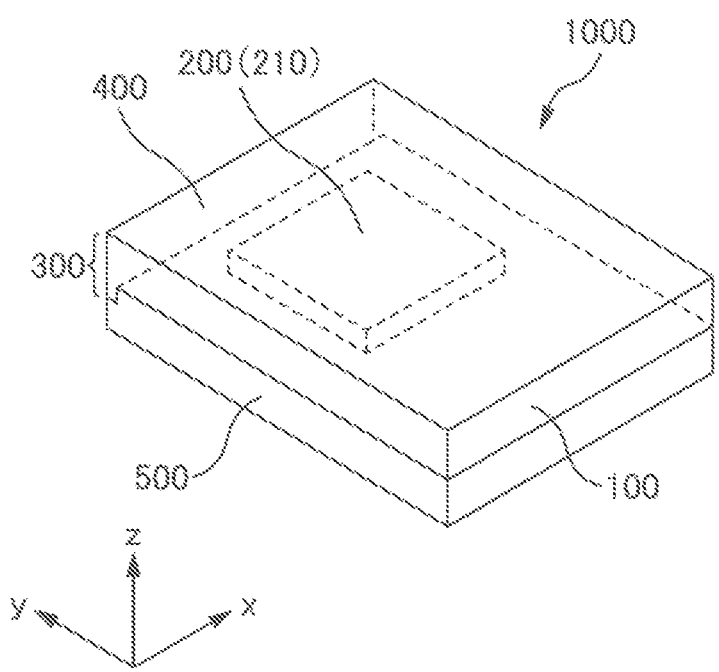
FIG. 2B is an external perspective view illustrating a wireless module according to an embodiment of the present disclosure.
Figure 3:
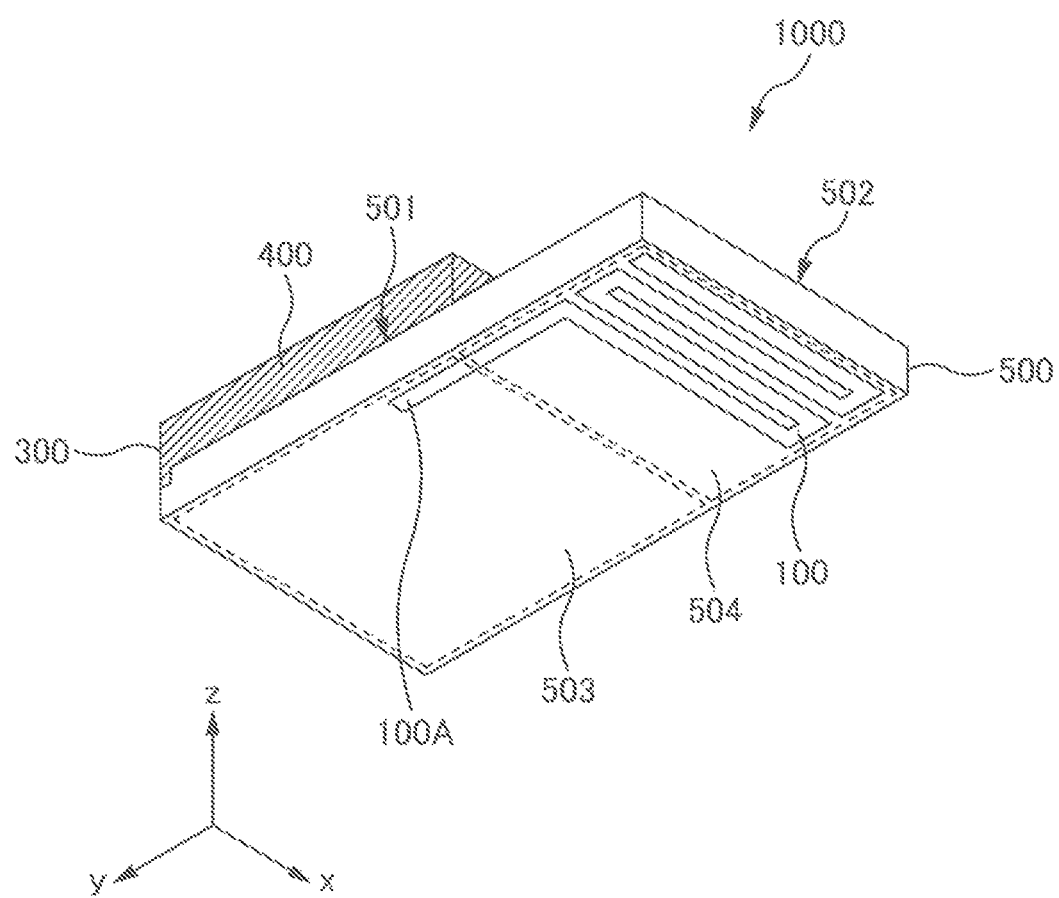
FIG. 3 is an external perspective view illustrating a wireless module according to an embodiment of the present disclosure.
Figure 4:
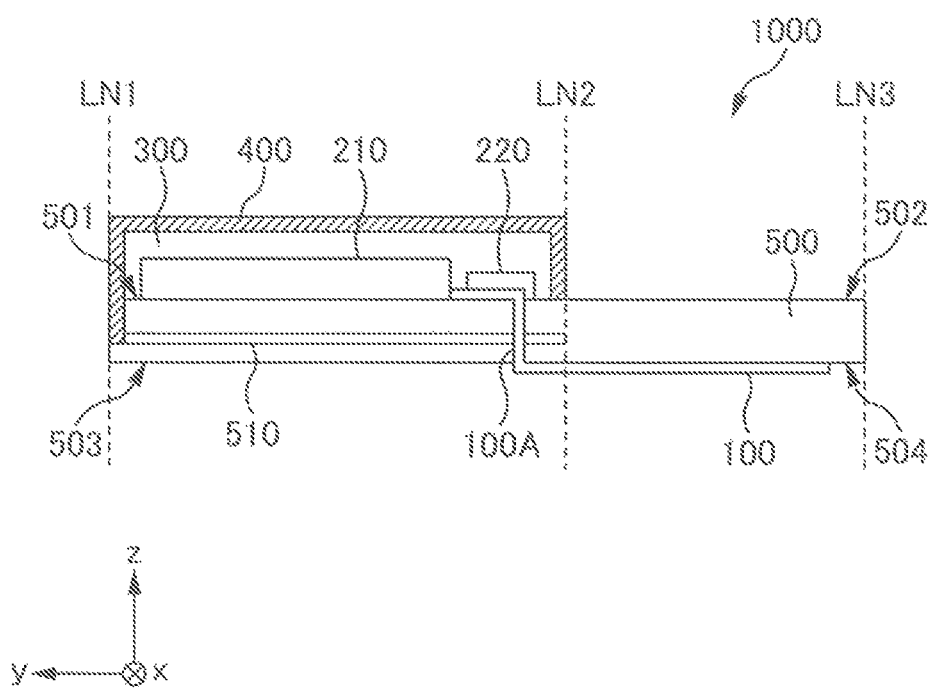
FIG. 4 is a cross-sectional view illustrating a wireless module according to an embodiment of the present disclosure.

FIGS. 2A, 2B, 3, and 4 illustrate the wireless module 1000 according to embodiments of the present disclosure. FIGS. 2A, 2B, and 3 are external perspective views illustrating the wireless module 1000, and FIG. 4 is a cross-sectional view illustrating the wireless module 1000.

In an embodiment of the present disclosure, on a front surface (one face) of the substrate 500 which will be described later when the wireless module 1000 is in plan view, a direction in which the electronic component mounting region 501 and a first antenna mounting region 502 are aligned is a y-axis direction (hereinafter the y-direction), a vertical direction is an z-axis direction (hereinafter the z-direction), a direction orthogonal to the y-axis and the z-axis is an x-axis direction (hereinafter the x-direction).

The wireless module 1000 includes the substrate 500, an electronic component 200, the antenna 100, the resin layer 300, and the shielding layer 400.

The substrate 500 is, as illustrated in FIG. 4, a multi-layer substrate in which a ground layer 510 configured to supply ground potential to the electronic component 200 is formed in an inner layer. Further, the substrate 500 is a substantially rectangular board having four sides along the x-direction and the y-direction, and having a board thickness (width in the z-direction) equal to or smaller than 1 mm (millimeter), for example, about 0.3 mm.

The ground layer 510 is a conductive pattern formed on a surface or an inner layer in a planar manner along the face of the substrate 500.

Further, in one face of the substrate 500 (front surface in FIGS. 2A and 2B), the electronic component mounting region 501 and the first antenna mounting region 502 are provided to be aligned adjacent in the y-direction without overlapping with each other. In the other face (back surface in FIGS. 2A and 2B), an electrode region 503 and a second antenna mounting region 504 are provided to be aligned adjacent in the y-direction without overlapping with each other.

The electrode region 503 is a region on the side opposite to the electronic component mounting region 501, while the second antenna mounting region 504 is a region on the side opposite to the first antenna mounting region 502, in the back surface of the substrate 500.

The electronic component 200 includes a semiconductor device such as an Integrated Circuit (IC). This semiconductor device is configured such that a bare chip is mounted face-up or face-down. Further, the electronic component 200 is the integrated circuit element 210 configured such that a semiconductor chip is sealed using a resin or a ceramic package. Further, the electronic component 200 includes a passive element such as a chip resistor, a chip capacitor and a coil, or the discrete electronic component 220 such as a crystal oscillator. The electronic component 200 is mounted in the electronic component mounting region 501 of the surface of the substrate 500.

The substrate 500 has the conductive patterns formed on the front surface, the inner layer and the back surface thereof, and has a multi-layer wiring structure via a through hole and/or a via, and implements a predetermined function, with the electronic component 200 being mounted thereto.

Here, the electronic component 200 includes an oscillator circuit configured with these integrated circuit element 210 and electronic component 220, and is configured to transmit or receive radio waves using the antenna 100 which will be described later.

Note that, as illustrated in FIGS. 1A to 1C, the electronic component 200 is mounted in the electronic component mounting region 501 of the surface of the substrate 500, and is not practically mounted in the first antenna mounting region 502.

The antenna 100 is configured with the conductive pattern formed in the second antenna mounting region 504 of the back surface of the substrate 500. FIG. 3 illustrates how the antenna 100 is formed in the second antenna mounting region 504 in the back surface of the substrate.

Further, as illustrated in FIG. 4, the electronic component 200 and the antenna 100 are electrically connected by an antenna connection portion 100A. The antenna connection portion 100A includes a via or a through hole and a conductive pattern formed in the substrate 500. Further, the conductive pattern includes wiring, an electrode or a pad connected to an end part of this wiring, and the like.

In the wireless module 1000 according to an embodiment of the present disclosure, the antenna 100 is formed on the back surface (second antenna mounting region 504) of the substrate 500, however, the antenna 100 may be formed on the front surface of the substrate 500 (first antenna mounting region 502).

In the case where the antenna 100 is formed on the back surface of the substrate 500, noise radiated from the integrated circuit element 210, which is a noise source in the electronic component 200, needs to pass the resins and various conductive patterns constituting the substrate 500, to reach the antenna 100 on the back side of the substrate 500. That is, since the conductive pattern is located therebetween, the antenna 100 is less affected by the noise radiated from the integrated circuit element 210.

Back to FIG. 2A, the resin layer 300 is formed in the electronic component mounting region 501 to seal the electronic component 200. The resin layer 300 may be formed over the entire electronic component mounting region 501, and also may be formed in only a portion where the electronic component 200 is mounted in the electronic component mounting region 501. The resin layer 300 is made of an insulating material and is constituted by, for example, a thermosetting resin such as an epoxy resin. A method for forming the resin layer 300 will be described later.

The shielding layer 400 is a conductive paste in which powder of metal, e.g., gold, silver, platinum, nickel, or copper, is dispersed in a resin, and the shielding layer 400 is formed such that the paste is applied on the surface of the resin layer 300 and then cured. In an embodiment of the present disclosure, a silver paste is used as one embodiment.

Accordingly, the electronic component 200 is sealed with the resin layer 300, and thereafter the surface of the resin layer 300 is covered with the shielding layer 400 having conductivity. Thus, it becomes possible to reduce leakage of noise caused by the electronic component 200 without using a metal case. Accordingly, the wireless module 1000 can be downsized.

Further, as illustrated in FIG. 4, the wireless module 1000 according to an embodiment of the present disclosure is formed such that the shielding layer 400 is electrically connected to the ground layer 510 inside the substrate 500 at an end face of the wireless module 1000 depicted by LN1. With such an embodiment, the shielding layer 400 is not required to be grounded using other means such as a wire, which can simplify the configuration of the wireless module 1000. Such reduction in the number of components lowers the failure rate of the wireless module 1000, which can enhance reliability.

Note that LN1 indicates one end face of the wireless module 1000, while LN3 indicates the other end face of the wireless module 1000. LN2 indicates a boundary between the electronic component mounting region 501 and the first antenna mounting region 502. Further, LN2 is also a boundary between the electrode region 503 and the second antenna mounting region 504.

FIG. 2B is a schematic diagram of FIG. 1A, in which resin sealing is performed in a range from the electronic component mounting region 501 to the first antenna mounting region 502, and this resin surface is covered with the shielding layer 400 throughout five faces. Other than the above, FIG. 2B is the same as FIG. 2A. Note that the side wall W of the shielding layer 400 and the antenna 100 are omitted for convenience sake in the drawing.

==Method for Manufacturing Wireless Module==

Next, a method for manufacturing the wireless module 1000 according to an embodiment of the present disclosure will be described with reference to FIGS. 5A to 5I.

Note that a method for manufacturing the wireless module 1000 will be described focusing on the wireless module 1000 of FIG. 1C. The method for manufacturing the wireless module 1000 of FIG. 1C is basically the same as the method for manufacturing the wireless module 1000 of FIG. 1A and the method for manufacturing the wireless module 1000 of FIG. 1B, and thus overlapping description is omitted.

Further, as has been described in the explanation of FIG. 1D, the plurality of the wireless modules 1000 are formed to be aligned in a matrix on a large-sized substrate 800, and results in being divided into individual pieces. Thus, the large-sized substrate 800 is also illustrated and explained as necessary as in FIG. 5B. Note that a broken line C is a cutting line (position) and corresponds to a dotted and dashed line C of FIG. 5B.

Figure 5A:
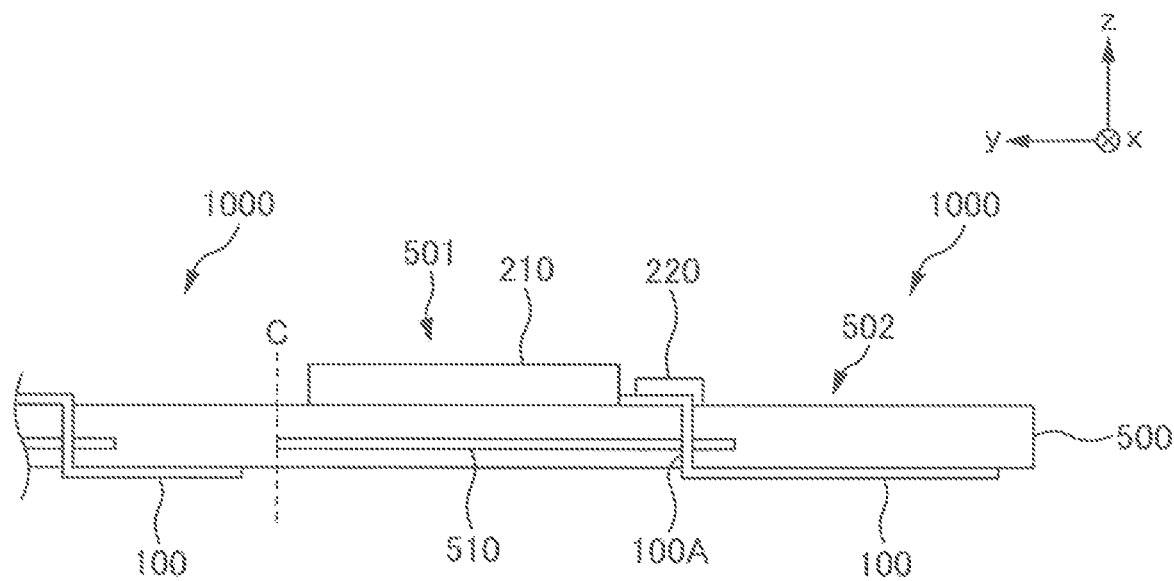
FIG. 5A illustrates a method for manufacturing a wireless module according to an embodiment of the present disclosure.
Figure 5B:
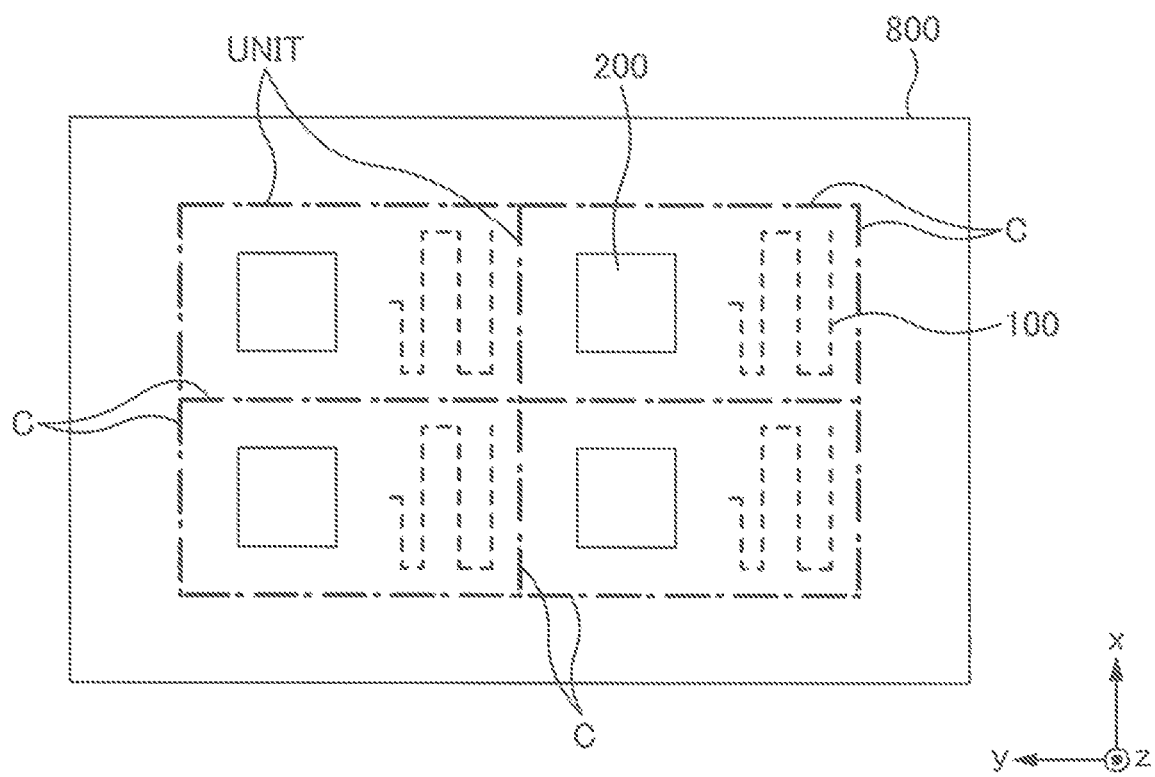
FIG. 5B illustrates a method for manufacturing a wireless module according to an embodiment of the present disclosure.

First, as illustrated in FIG. 5A, the antenna 100 is formed (antenna forming process) during a process of forming the substrate 500.

The substrate 500 is formed in a normal process and is constituted by, for example, a multi-layer substrate. In this multi-layer substrate, a conductive pattern is formed on the front layer, the back layer, and/or the inner layer connecting therebetween, the inner layer formed between insulation layers, and they are electrically connected through a via, a through hole, etc. In this manufacturing process, the antenna 100 is also formed.

In FIG. 5A, the antenna 100 is formed in the second antenna mounting region 504 on the back surface of the substrate 500, and thus is formed together with a conductive pattern, specifically, an external connection pad, on the back side of the substrate 500 in the forming process. Then, the antenna 100 is electrically connected to the electronic component 200, to function. Here, the pad is made of copper, and the pattern of the antenna 100 is also made of copper. The antenna 100 may be formed on the front side of the substrate 500, or formed on the inner layer.

At the same time as the antenna forming process is performed, the ground layer 510 and the antenna connection portion 100A inside the substrate 500 are also formed in addition to the antenna 100. At this occasion, the ground layer 510 is formed such that, when the substrate 500 is cut at the cutting line C, the ground layer 510 is exposed on a cutting surface.

Next, as illustrated in FIG. 5A, the electronic component 200 is mounted in the electronic component mounting region 501 on the surface of the substrate 500 (electronic circuit mounting process). At this time, in an embodiment of the present disclosure, the electronic component 220 is disposed between the integrated circuit element 210 and the first antenna mounting region 502. This is for explaining the wireless modules 1000 in FIGS. 1A to 1C at a time, and the electronic component 220 is omitted in the wireless modules 1000 in FIGS. 1A and 1B.

Accordingly, the provision of the electronic component 220 can ease such unevenness that is created on the top surface of the resin layer 300 formed on the substrate 500. The details thereof will be described later.

The electronic component 200 includes an active element such as the semiconductor device 210, a passive component such as a chip resistor, and a chip capacitor, and further an electronic component such as a crystal oscillator. The semiconductor device 210 includes the semiconductor device 210 configured such that a bare chip is mounted face-down, a bare chip is mounted face-up, or a bare chip is packaged by being sealed with a resin or ceramic. Such electronic component 200 and conductive pattern are connected to implement a predetermined function.

Hereinabove, the substrate 500 in which the electronic component 200 and the antenna 100 are mounted is prepared.

Figure 5C:
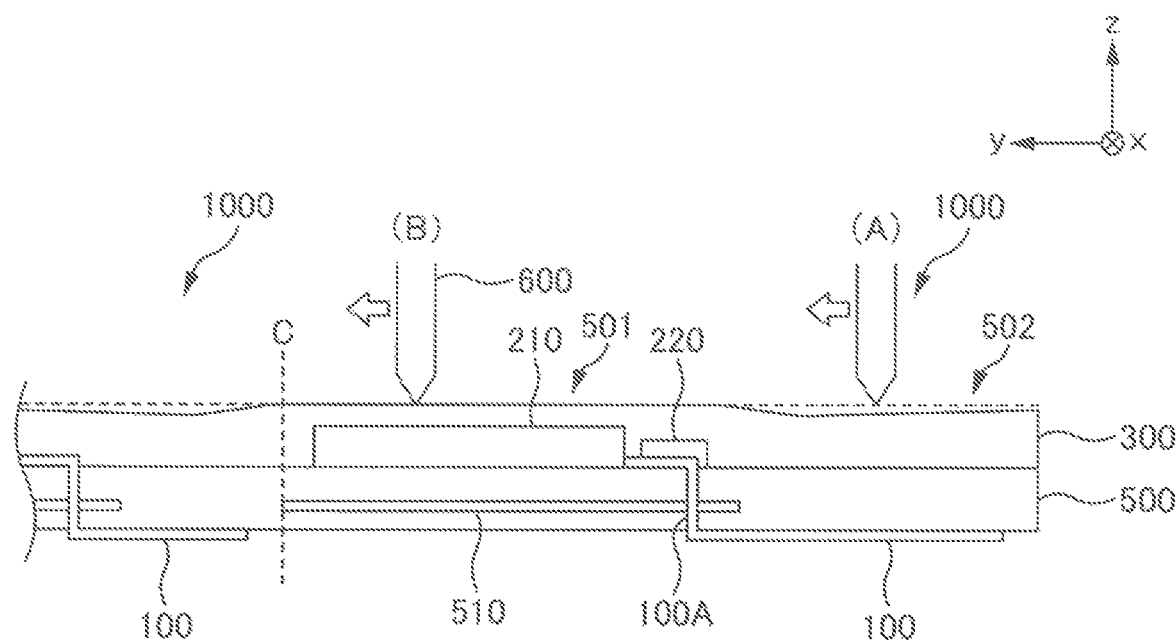
FIG. 5C illustrates a method for manufacturing a wireless module according to an embodiment of the present disclosure.

Next, as illustrated in FIG. 5C, the surface of the substrate 500 is covered with a resin material, and the resin layer 300 is formed to cover all the units aligned in a matrix (resin layer forming process).

This resin layer 300 is formed, as in FIG. 5C, by the printing method or the potting method.

In the printing method, a metal mask (not illustrated) or a screen mask (not illustrated) is placed on the substrate 500, and a resin material having viscosity and fluidity is applied onto this mask. Then, a squeegee 600 depicted in FIG. 5C is used to broadly apply the resin material to the substrate 500 disposed under the mask, while rubbing the mask.

As described above, the tallest one in the electronic component 200 disposed in the electronic component mounting region 501 is the LSI chip 210 here, and thus has a height of, for example, 0.4 mm. Further, a chip capacitor is mounted as the passive element 220 and has a height of 0.2 mm. Then, in FIG. 5C, the pattern of the antenna 100 is formed on the back side of the substrate 500; however, even if it is formed on the front side, the thickness thereof is 0.02 mm.

That is, when the antenna 100 is formed on the back side, a difference in height from the substrate 500 is 0.4 mm. Even if the antenna 100 is formed on the front side, the difference in height is 0.38 mm, and the difference in height corresponds to the thickness of the LSI chip 210 from which substantially the thickness of the antenna 100 is subtracted. Accordingly, both in the printing method and in the potting method, fluidity and viscosity of the resin material causes such a difference in height as illustrated in FIG. 1D. Further, in the printing method, the squeegee 600 is made of a resin having elasticity, and thus greatly scrapes off a resin on the antenna 100 since a solid member, such as a semiconductor device or a back surface of a chip or a package, is not provided thereon.

Accordingly, as illustrated in FIG. 1D, it becomes important to apply a resin material such that a bottom part of a recessed portion is covered at a height H3 exceeding the top part H1 of the tallest electronic component 210, e.g., the semiconductor device 210. That is, as indicated by the line L2, the resin material is applied thick to some extent to cover the bottom part so that, even if the resin material on the first antenna mounting region 502 is scraped off, the bottom part of the recessed portion of the resin layer 300 is higher than the tall electronic component 210 after a cure process which will be described later.

The same applies to the potting method. In contrast to the printing method, the resin material is discharged from a nozzle in the potting method, however, since a difference in height is also created, the substrate 500 needs to be covered with the resin material at the height H3 so that the bottom part of the recessed portion exceeds the top part H1 of the tall electronic component 210, e.g., the semiconductor device 210.

Since the height in the first antenna mounting region 502 corresponds to the thickness of the conductive pattern which is thin even if the antenna 100 is provided, the resin may flow slowly, and thus the covered resin thickness is greater than the resin thickness in the electronic component mounting region 501. In this case, cure shrinkage is great corresponding to this great thickness of the covered resin; however a thickness of a covering resin is adjusted in consideration of such shrinkage.

Subsequently, a cure process is performed. A thermosetting resin such as an epoxy resin starts crosslinking during a cure process in a chemical reaction, and cure shrinkage is generated. Further, a thermoplastic resin is cured by being cooled as it is.

As a result, as illustrated in FIG. 5C, such a state is brought that the recessed portion is cured at a position slightly higher than the top part of the tall component 210, e.g., the semiconductor device 210. In this case, "swells" exist, however, when polishing/grinding is performed, the substrate can be finished flat in a range from the electronic component mounting region 501 to the first antenna mounting region 502.

Figure 5D:
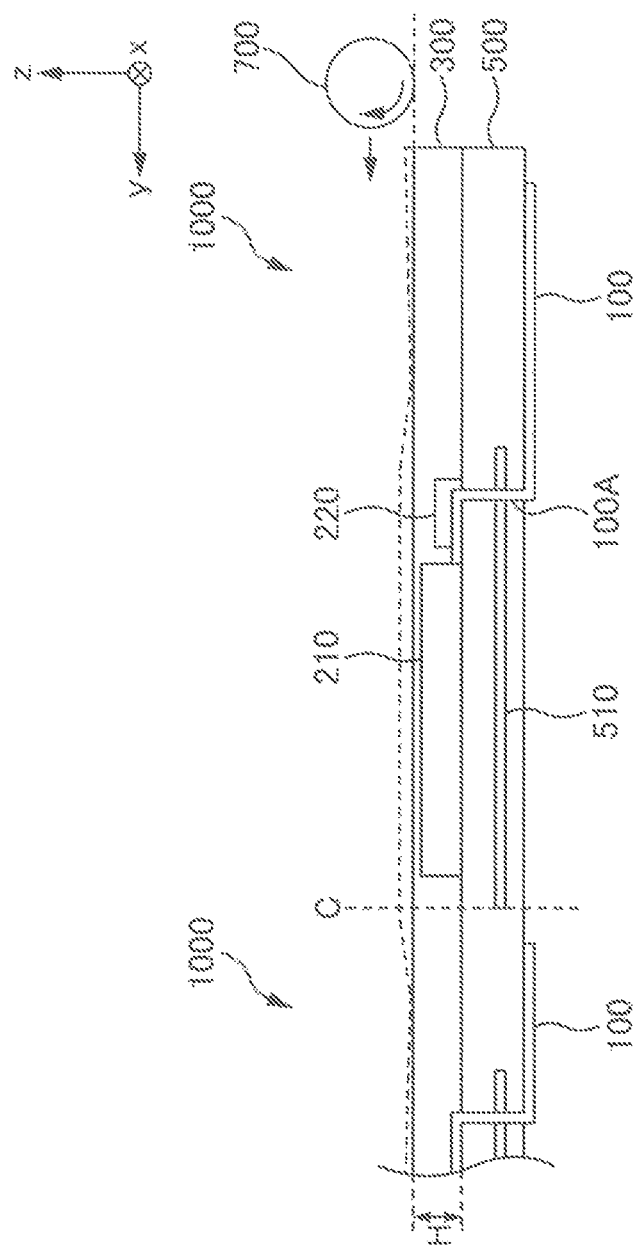
FIG. 5D illustrates a method for manufacturing a wireless module according to an embodiment of the present disclosure.

Subsequently, as illustrated in FIG. 5D, a cutting apparatus or a polishing apparatus is used to perform a process of flattening a surface.

A dicing apparatus 700 is commonly used as this apparatus.

Here, grinding or polishing is performed so that a surface of the resin layer 300 on the electronic component mounting region 501 and the antenna mounting region 502 or 504 becomes a substantially flat surface. It is assumed that the top part of the semiconductor device 210 does not deteriorate due to moisture and has such a thickness that withstand voltage characteristics can be maintained. Further, in the case of a flip chip such as a WLP, the back surface of the chip is positioned on the top side. In this case, if necessary, grinding may be performed such that the back surface of the chip and the resin layer 300 becomes in the same plane.

As a result, a surface of the resin layer 300 on the electronic component mounting region 501 and the antenna mounting region 502 is substantially flattened. Consequently, in the formation of the shielding layer 400, it becomes possible to form the shielding layer 400 having a uniform film thickness without forming the accumulation portion which is described in the technical problem.

The dicing apparatus 700, when having shaven once from right to left (in the y-direction), is displaced in the x-direction such that a shaven (ground) surface partially overlaps, and shaves from right to left (in the y-direction). With such an operation being repeated, the entire surface of the resin layer 300 is ground/polished flat.

Note that the resin layer 300 according to embodiments of the present disclosure is shaven so as to be substantially flat, however, the resin layer 300 may not be flat, as long as shaving is performed so as to reduce a difference in height in the resin layer 300.

Further explanation will be made with reference to FIG. 1D. Reduction in the depth of the accumulation portion R1 decreases the amount of Ag paste, thereby exerting the effects of embodiments of the present disclosure. That is, the resin layer 300 is polished so as to reduce a difference in height, such as L1 or L2 after curing a resin. In other words, the resin layer 300 is polished so as to reduce the depth of the recessed portion of the Ag paste accumulation portion.

Figure 5E:
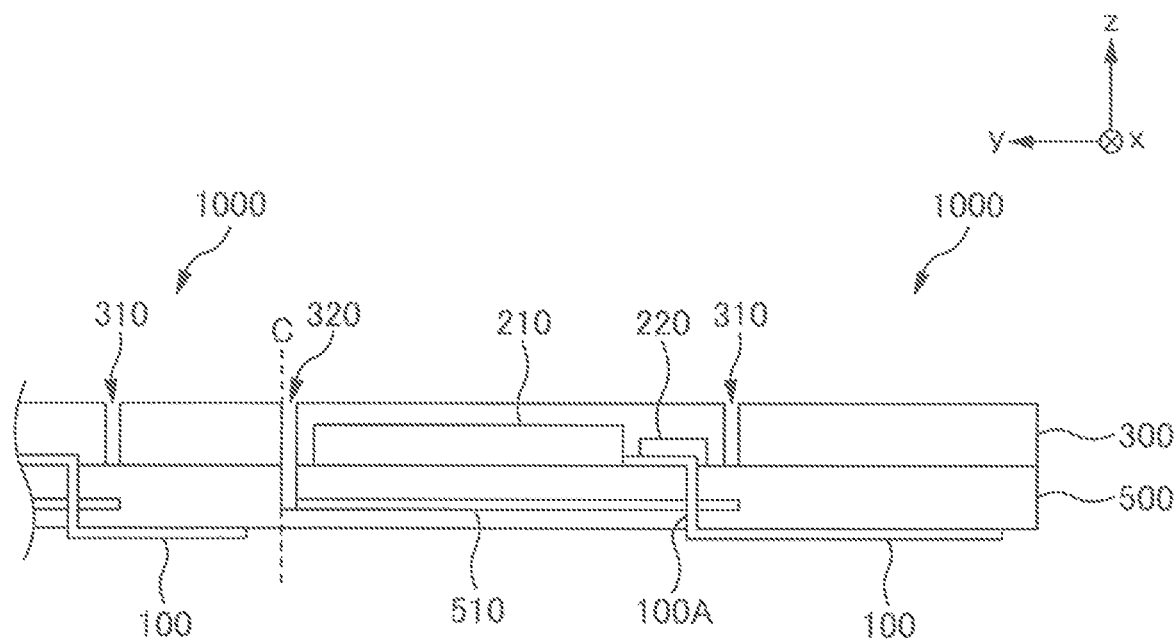
FIG. 5E illustrates a method for manufacturing a wireless module according to an embodiment of the present disclosure.
Figure 5F:
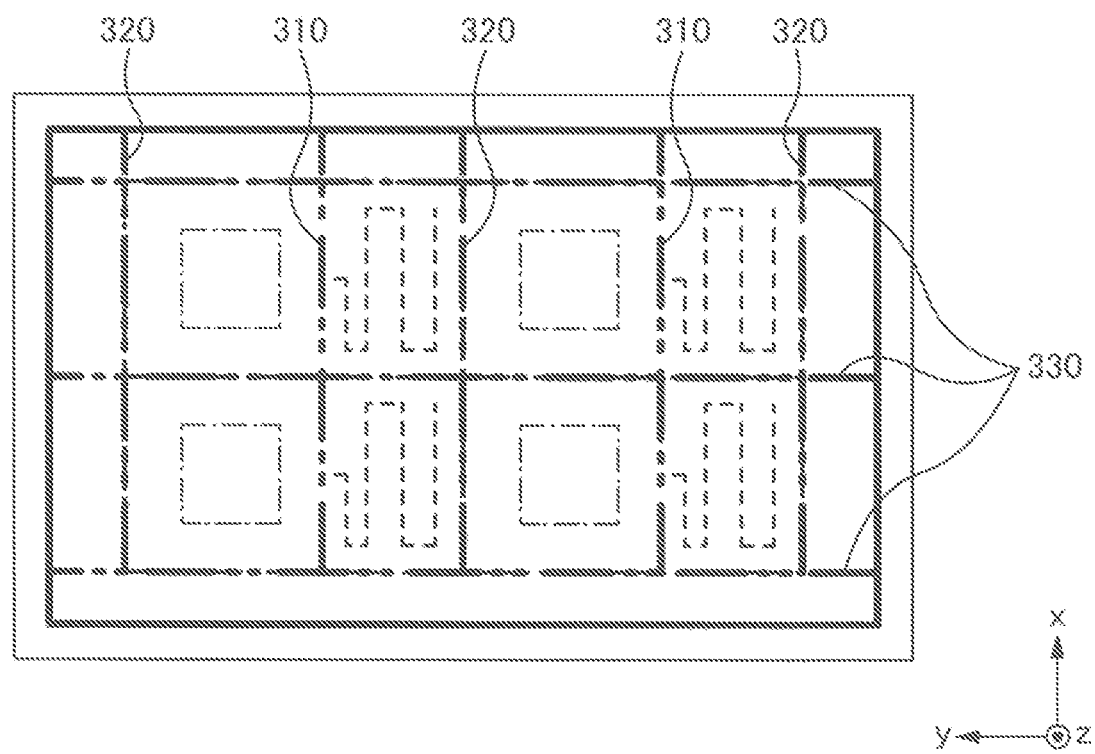
FIG. 5F illustrates a method for manufacturing a wireless module according to an embodiment of the present disclosure.

Thereafter, as illustrated in FIGS. 5E and 5F, the resin layer 300 represented by a solid line and grooves 310, 320, 330 represented by dotted and dashed lines are formed.

The grooves 310, 320 need to be formed so as to form the shielding layer 400 also on the side surfaces of the wireless module 1000.

The grooves 330 form two side surfaces on the long sides, and half-cut dicing is performed to cut up to the substrate 500 or up to the inner layer of the substrate 500. Further, the grooves 320 expose a ground line on the LN1 side, and half-cut dicing is performed up to the inner layer of the substrate 500. Further, the grooves 310 reaching the front surface or the inner layer of the substrate 500 are formed.

Figure 5G:
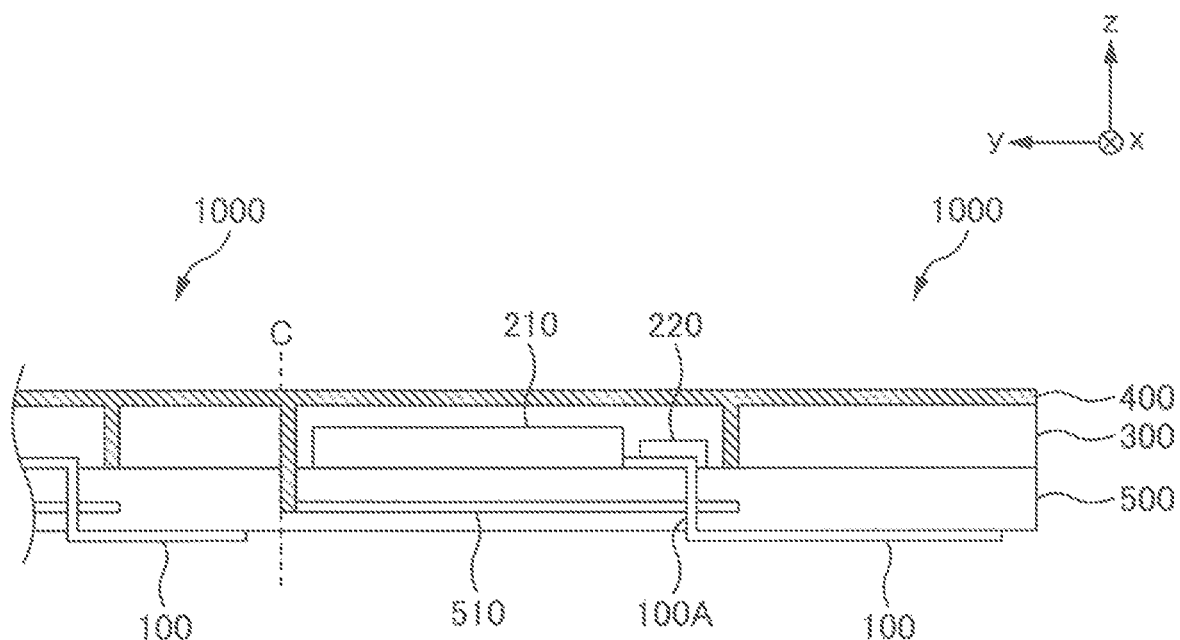
FIG. 5G illustrates a method for manufacturing a wireless module according to an embodiment of the present disclosure.

Then, as illustrated in FIG. 5G, a shielding material having fluidity/viscosity is provided onto the surface of the resin layer 300 including the insides of the grooves 310, 320, 330. For example, when using the aforementioned printing method, Ag paste is formed by printing. The squeegee 600 is used to rub on the flat resin layer 300, thereby forming the shielding layer 400 having a substantially uniform film thickness. Further, in a spinning process, a resin dissolved in a solvent and a solution containing metal powder are applied by spreading a thin layer by the centrifugal force of rotation (shielding layer forming process).

In either of the methods, a flat surface without "swells" is formed on the resin layer 300, and further the shielding layer 400 is formed thereon. Thus, a shielding material enters the grooves 310, 320, 330, and a shielding film having a uniform film thickness can be formed.

At this time, the shielding layer 400 formed inside the grooves 320 is electrically connected to the ground layer 510 inside the substrate 500.

Thereafter, full-cutting is performed such that four side surfaces of the shielding layer 400 are left, thereby being able to achieve the wireless module 1000 in FIG. 1A.

In FIGS. 1B and 1C, the subsequent process is performed in order to remove the resin layer 300 and the shielding layer 400 in the first antenna mounting region 502.

Figure 5H:
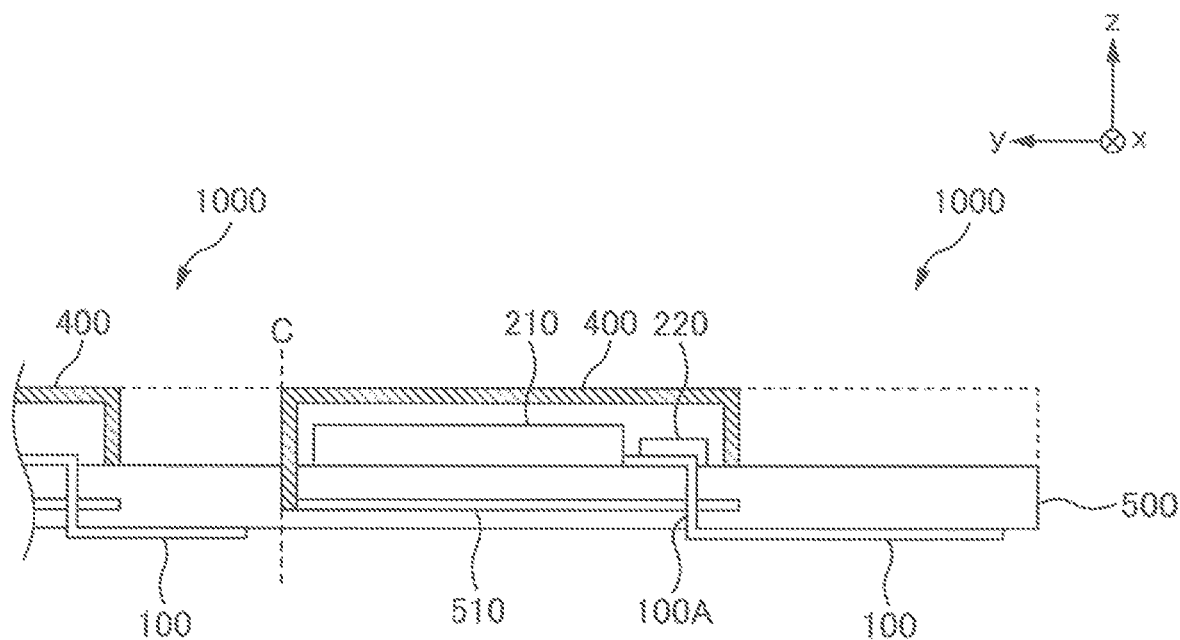
FIG. 5H illustrates a method for manufacturing a wireless module according to an embodiment of the present disclosure.

FIG. 5H illustrates such a removing process. As illustrated in FIG. 5H, the resin layer 300 and the shielding layer 400 formed on the first antenna mounting region 502 in the resin layer 300 and the shielding layer 400 formed on the entire front surface of the substrate 500 is removed by a cutting process using the polishing/grinding apparatus (removing process).

Figure 5I:
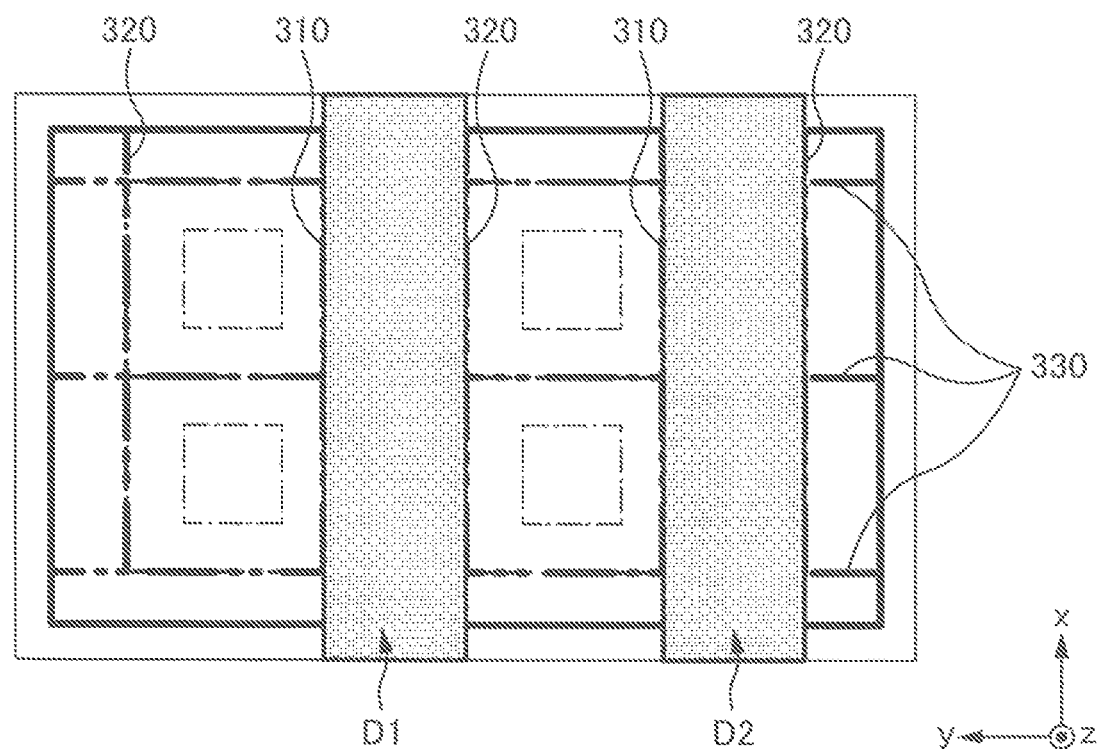
FIG. 5I illustrates a method for manufacturing a wireless module according to an embodiment of the present disclosure.

Here, cutting is performed also using the dicing apparatus 700, and the dicing blade is allowed to pass through portions indicated by D1, D2 in FIG. 5I up and down and cut away.

That is, in FIG. 5H, cutting is performed such that left and right side walls of the shielding layer 400 are left. All of the shielding layer 400 and the resin layer 300 on the first antenna mounting region 502 side may be removed, while a part thereof may be left. With such an embodiment, five faces of the resin layer 300 and the shielding layer 400 can be formed in the electronic component mounting region 501.

At this time, removing of the resin layer 300 and the shielding layer 400 from the first antenna mounting region 502 so that the substrate 500 is exposed, exerts the following effects. Thickness in the first antenna mounting region 502 of the wireless module 1000 is reduced, and reduction in strength of radio waves transmitted or received by the antenna 100 formed in the second antenna mounting region 504 is restrained, thereby being able to minimize reduction in transmission sensitivity and reception sensitivity of the antenna 100.

Thereafter, full-cutting is performed such that four side surfaces of the shielding layer 400 in the electronic component mounting region 501 is left, thereby being able to achieve the wireless module 1000 in FIGS. 1B and 1C.

As has been described above, according to the method for manufacturing the wireless module 1000 of embodiments of the present disclosure, in the wireless module 1000 that is configured such that the antenna 100 and the electronic component 200 are mounted to the substrate 500 and sealed with a resin, it becomes possible to reduce an amount of conductive paste use necessary for forming the shielding layer 400, thereby being able to reduce the manufacturing cost. Note that, in the present disclosure, when the resin layer 300 and the shielding layer 400 formed in the first antenna mounting region 502 are removed by the cutting process in the removing process, the resin layer 300 may be left thin with a predetermined thickness, without being completely removed from the substrate 500.

Further, as illustrated in FIGS. 1A to 1C as well, since a flat front surface spreads over a surface from the electronic component mounting region 501 to the first antenna mounting region 502, a distance between the shielding layer 400 and the tallest element 210 can be secured. Herein, a predetermined distance of the thickness between the corner portion P1 of the semiconductor chip 210 and the shielding layer 400 can be secured with a uniform thickness, without the corner portion P1 and the shielding layer 400 becoming close. This can enhance withstand voltage characteristics and environmental resistance.

The embodiments described above are to facilitate the understanding of the present disclosure and is not in any way to be construed as limiting the disclosure. It is needless to say that the disclosure may variously be changed or altered without departing from its gist, and encompass equivalents thereof.

What is claimed is:

1. A method for manufacturing a wireless module, comprising:
   a preparing step of preparing a substrate, the substrate including
      one or more of electronic components provided on a front surface of the substrate in an electronic component mounting region, and a conductive pattern formed on a back surface of the substrate, the conductive pattern being provided in an antenna mounting region adjacent to the electronic component mounting region, the conductive pattern being configured to act as an antenna, a covering step of covering the electronic component mounting region and the antenna mounting region of the substrate with a resin material having viscosity and fluidity such that the resin material has a recessed portion and a height of a lowest part of the recessed portion of the resin material is higher than a height of a tallest one of the electronic components, a grinding or polishing step of curing the resin material to form a resin layer, and thereafter, grinding or polishing the resin layer so as to substantially flatten a surface of the resin layer on the electronic component mounting region and the antenna mounting region, a groove forming step of forming a vertically penetrating groove in the flattened resin layer that reaches the front surface of substrate thereunder at a boundary between the electronic component mounting region and the antenna mounting region by half-cutting dicing, a covering step of covering the flattened resin layer having the vertically penetrating groove with a shielding material having viscosity and fluidity so that surfaces of the flattened resin layer are covered by the shielding material and so that the vertically penetrating groove at the boundary between the electronic component mounting region and the antenna mounting region is filled with the shielding material, and an antenna region exposing step of removing, by grinding or polishing downwardly from a top surface of the shielding material, an entirety of the shielding material on a front surface of the flattened resin layer in the antenna mounting region and an entirety of the flattened resin layer thereunder in the antenna mounting region so as to expose the front surface of the substrate in the antenna mounting region, the exposed front surface in the antenna mounting region spanning an entirety of the antenna mounting region, the antenna region exposing step not removing the shielding material and the flattened resin layer in the electronic component mounting region or the shielding material in the vertically penetrating groove so that every exposed surface of the flattened resin layer in the electronic component mounting region is covered by the shielding material.

2. The method for manufacturing a wireless module according to claim 1, wherein
the covering step of covering the mounting regions with the resin material includes broadly covering the front surface of the substrate with the resin material having viscosity by a printing method, and
the covering step of covering the resin layer with the shielding material includes printing or spin-coating using the shielding material having fluidity.

3. The method for manufacturing a wireless module according to claim 1, wherein
the covering step of covering the mounting regions with the resin material includes covering the mounting regions with the resin material having viscosity by a potting method, and
the covering step of covering the resin layer with the shielding material includes printing or spin-coating using the shielding material having fluidity.

4. The method for manufacturing a wireless module according to claim 2, wherein
the shielding material having fluidity is a paste into which a conductive material is mixed or a liquid into which a conductive material is mixed.

5. The method for manufacturing a wireless module according to claim 1, wherein
the preparing step of preparing the substrate includes disposing an electronic component that is shorter than a tallest electronic component, at a location between the antenna mounting region and the tallest electronic component, in the electronic component mounting region.

6. The method for manufacturing a wireless module according to claim 1,
wherein the substrate includes a ground line in an inner layer of the substrate in the electronic component mounting region,
wherein the groove forming step includes forming another vertically penetrating groove that penetrates through the flattened resin layer and a portion of the substrate and that reaches the ground line in the substrate, and
wherein the covering step of covering the flattened resin layer with the shielding material causes said another vertically penetrating groove to be filled with the shielding material so that the shielding material is in contact with the ground line in the substrate.

* * * * *